(12) United States Patent
Zhao

(10) Patent No.: US 9,698,371 B2
(45) Date of Patent: Jul. 4, 2017

(54) OLED DEVICE AND PREPARATION METHOD THEREOF

(71) Applicant: SHENZHEN CHINA STAR OPTOELECTRONICS TECHNOLOGY CO., LTD., Shenzhen, Guangdong (CN)

(72) Inventor: Guo Zhao, Shenzhen (CN)

(73) Assignee: SHENZHEN CHINA STAR OPTOELECTRONICS TECHNOLOGY CO., LTD., Shenzhen (CN)

(*) Notice: Subject to any disclaimer, the term of this patent is extended or adjusted under 35 U.S.C. 154(b) by 165 days.

(21) Appl. No.: 14/374,227

(22) PCT Filed: Apr. 25, 2014

(86) PCT No.: PCT/CN2014/076215
§ 371 (c)(1),
(2) Date: Jul. 24, 2014

(87) PCT Pub. No.: WO2015/158011
PCT Pub. Date: Oct. 22, 2015

(65) Prior Publication Data
US 2015/0303400 A1  Oct. 22, 2015

(30) Foreign Application Priority Data

Apr. 18, 2014 (CN) .......................... 2014 1 0157528

(51) Int. Cl.
*H01L 21/31* (2006.01)
*H01L 51/52* (2006.01)

(52) U.S. Cl.
CPC ................................ *H01L 51/5253* (2013.01)

(58) Field of Classification Search
CPC ........................... H01L 51/5237; H01L 51/56
USPC .......................................................... 257/40
See application file for complete search history.

(56) References Cited

U.S. PATENT DOCUMENTS

| 2004/0145311 A1* | 7/2004 | Su ........................ H01L 51/5253 313/512 |
| 2012/0121856 A1* | 5/2012 | Chang ................. C23C 14/0036 428/141 |
| 2015/0065642 A1* | 3/2015 | Chau ...................... C23C 14/06 524/546 |

\* cited by examiner

*Primary Examiner* — Cory Eskridge

(57) ABSTRACT

An OLED device and a preparation method thereof are provided by the present invention; the OLED device comprises an OLED device body and a protective layer which coats outside the OLED device body and is configured to package the OLED device body; the chemical formula of the protective layer is $SiO_xC_yH_z$, wherein the value of X is 0.5~2.5, the value of Y is 0.5~2.0, and the value of Z is 2~8. In the present invention, the protective layer is deposited outside the OLED device to isolate water vapor.

1 Claim, 1 Drawing Sheet

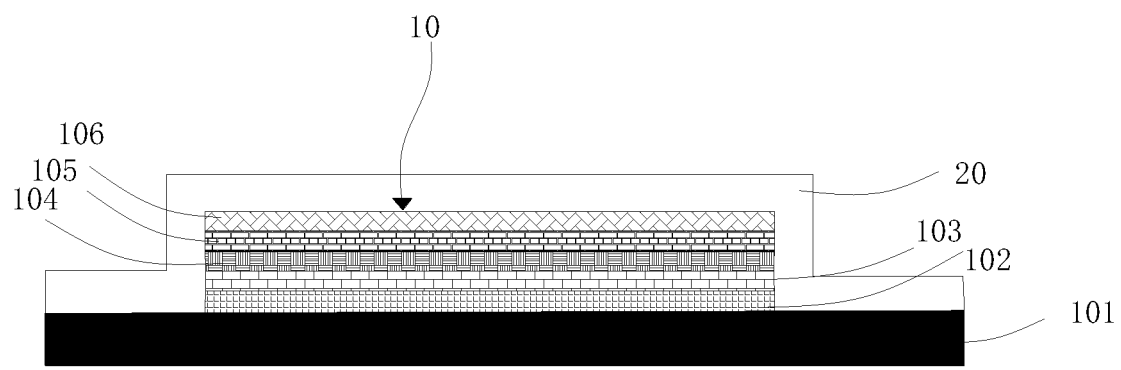

OLED DEVICE AND PREPARATION METHOD THEREOF

FIELD OF THE INVENTION

The present invention relates to the field of OLED devices and preparation methods thereof, more specifically, relates to an OLED device having water vapor isolation function and a method for preparing the OLED device.

BACKGROUND

Recently, organic light emitting displays (OLEDs), because of simple structures, excellent brightness, and significant advantages, have gradually become substitutes of liquid crystalline displays (LCDs) which are the mainstream on the market at present.

However, the organic light emitting displays utilize light-emitting components composed of organic material as displaying light-emitting sources. Thereby, when preparing the organic light emitting displays, it has stringent requirements for water vapor isolation extent of preparing environments and using places. If water vapor contacts the organic light-emitting components, cathodes of the light-emitting components will be oxidized, which makes the light-emitting components lose display function, and thus the quality of products will be reduced.

Therefore, the organic light-emitting components need to be packaged by material having lower water vapor penetrating rate, so that the organic light-emitting components are isolated from water vapor in external environment, and thereby the quality of products can be improved.

SUMMARY

To solve the drawbacks that OLED devices are prone to contact water vapor in preparation processes thereof, the present invention provides an OLED device having water vapor isolation function and a method for preparing the OLED device.

The technical solutions to solve the technical problem are as follows:

An OLED device, comprising an OLED device body and a protective layer which coats outside the OLED device body and is configured to package the OLED device body; wherein the chemical formula of the protective layer is $SiO_xC_yH_z$; and wherein the value of X is 0.5~2.5, the value of Y is 0.5~2.0, and the value of Z is 2~8.

The thickness of the protective layer is 300 A~600 A.

This present invention further provides a method for preparing an OLED device, comprising the following steps:

providing an OLED device body as a substrate;

using teflon and monox as a mixed target, and forming a $SiO_xC_yH_z$ protective layer on the substrate by a magnetron sputtering coating method, wherein the value of X is 0.5~2.5, the value of Y is 0.5~2.0, and the value of Z is 2~8.

According to the preparation method, the mixed target is composed of teflon and monox at a mass ratio of 3:1~4:1.

According to the preparation method, in the magnetron sputtering process for forming the $SiO_xC_yH_z$ protective layer, the substrate is biased with a bias voltage of −300V~−500V, the sputtering temperature is 150° C.~420° C., argon gas is used as the working gas and is injected at a flow rate of 300 sccm~500 sccm, and the sputtering time is 20 min~60 min.

This present invention further provides a method for preparing an OLED device, comprising the following steps:

providing an OLED device body as a substrate;

using trimethyl chlorine silicomethane and hexamethyl disilane as mixed gas, and forming a $SiO_xC_yH_z$ protective layer on the substrate by a plasma-enhanced chemical vapor deposition method, wherein the value of X is 0.5~2.5, the value of Y is 0.5~2.0, and the value of Z is 2~8.

According to the preparation method, the mixed gas is composed of trimethyl chlorine silicomethane and hexamethyl disilane at a mass ratio of 1:1~4:1.

According to the preparation method, in the plasma-enhanced chemical vapor depositing process for forming the $SiO_xC_yH_z$ protective layer, a pressure of a reaction chamber is kept at 1200 mT~1600 mT, high frequency AC power of 5000 w~7500 w is applied to the mixed gas, and the temperature of the substrate is kept at 200° C.~400° C.

When implementing the present invention, the following advantageous effects can be achieved: a protective layer is deposited outside the OLED device to isolate water vapor. The protective layer is $SiO_xC_yH_z$ composed of organic materials or inorganic material, wherein the value of X is 0.5~2.5, the value of Y is 0.5~2.0, and the value of Z is 2~8. The protective layer can keep water vapor penetration rate below 0.02 g/m$^2$/day. When the thickness of the protective layer is 300 A~600 A, better water vapor isolation effect can be achieved. Thus, raw material for preparing the protective layer can be saved, and the structure of the OLED device can be simplified.

Furthermore, the method for preparing the OLED device provided by the present invention has advantages of simple technology and easy operation. The protective layer is deposited on the body of the OLED device by a magnetron sputtering coating method or a chemical deposition method, which can make the protective layer be combined with the OLED device more firmly, so that service lifetime of the OLED device is prolonged and the quality of the OLED device is improved.

BRIEF DESCRIPTION OF THE DRAWINGS

The present invention will be further described with reference to the accompanying drawings and embodiments in the following, in the accompanying drawings:

FIG. 1 is a structural schematic view of an OLED device in accordance with an embodiment of the present invention.

DETAILED DESCRIPTION

To make the objects, technical schemes and advantages more clearly, the present invention may be further described in detail with reference to the accompanying drawings and embodiments.

In one embodiment of the present invention, a protective layer is deposited outside the OLED device to achieve the purpose of isolating water vapor. The protective layer is made of $SiO_xC_yH_z$ composed of organic materials or inorganic material, wherein the value of X is 0.5~2.5, the value of Y is 0.5~2.0, and the value of Z is 2~8. The protective layer can keep water vapor penetration rate below 0.02 g/m$^2$/day. When the thickness of the protective layer is 300 A~600 A, better water vapor isolation effect can be achieved. In this embodiment of the present invention, a method for preparing the OLED device, which has the advantages of simple technology and easy operation, is provided. The protective layer is deposited on the body of the OLED device by a magnetron sputtering coating method or a chemical deposition method, which can make the protective layer be combined with the OLED device more firmly, so that service lifetime of the OLED device is prolonged and the quality of the OLED device is improved.

Referring to FIG. 1, one embodiment of the present invention provides an OLED device comprising an OLED device body 10 and a protective layer 20 which coats outside the OLED device body 10 and is configured to package the OLED device body 10.

The OLED device body 10 includes a substrate 101, a positive pole and TFT component layer 102, a transport layer 103, a light-emitting component layer 104, an electron transport layer 105, and a negative pole layer 106. Along the substrate 101, the positive pole and TFT component layer 102, the transport layer 103, the light-emitting element layer 104, the electron transport layer 105, and the negative pole layer 106 are sequentially stacked on the substrate 101 and arranged to be sequentially away from the substrate 101. The protective layer 20 extends along a surface of the substrate 101, and further extends toward a direction that is away from the surface of the substrate 101 to package the positive pole and TFT component layer 102, the transport layer 103, the light-emitting element layer 104, the electron transport layer 105, and the negative pole layer 106. The substrate 101 is made of glass or soft acrylic material. The protective layer 20 is formed by a magnetron sputtering coating method or a chemical vapor deposition method.

The chemical formula of the protective layer 20 is $SiO_XC_YH_Z$, wherein the value of X is 0.5~2.5, the value of Y is 0.5~2.0, and the value of Z is 2~8. The protective layer can keep water vapor penetration rate below 0.02 $g/m^2/day$.

A thickness of the protective layer 20 is 300 A~600 A. When the protection layer 20 has such a thickness, it can achieve better water vapor isolation effect. Thus, raw material for preparing the protective layer 20 can be saved and the structure of the OLED device can be simplified. Of course, in other embodiments, the thickness of the protective layer 20 can be larger or smaller values according to various needs.

The present invention further provides a method for preparing an OLED device, which comprises the following steps:

providing an OLED device body as a substrate, and then the substrate is pre-treated. The pre-treating process comprises the following steps:

a surface of the substrate is successively wiped by deionized water and absolute ethanol;

the substrate is positioned in an ultrasonic cleaner filled with acetone solution and is cleaned by ultrasonic, so that impurity and oil pollution are removed from the surface of the substrate.

The surface of the substrate treated by the aforementioned pre-treating process is cleaned by plasma, so that smudge can be further removed from the surface of the substrate and binding force between the surface of the substrate and subsequent coating layers can be improved.

The substrate is positioned in a coating chamber of a magnetron sputtering coater. A mixed target, which is composed of teflon and monox at a mass ratio of 3:1~4:1, is placed in the coating chamber. The monox is common SiOx. The coating chamber is then vacuumized until the base pressure is $3.0 \times 10^{-5}$ Torr. Argon gas (the purity of the argon gas is 99.999%) is used as working gas, and is injected into the coating chamber at a flow rate of 300 sccm (standard-state cubic centimeters per minute) ~500 sccm. The substrate is then biased with a bias voltage of −300V~−500V, so that a high-frequency voltage is generated in the coating chamber. The coating chamber is heated to the temperature of 150° C.~420° C. (that is, the sputtering temperature is 150° C.~420° C.). The mixed target is used as a negative pole and the substrate is used as a positive pole, and thus argon gas near the mixed target generates arc discharge and is ionized to generate Ar+ ions. The Ar+ ions are accelerated in electric field to obtain extremely high energy, and then impact the mixed target. Atoms on a surface of the mixed target are sputtered and deposit on the surface of the substrate to form a protective layer made of $SiO_XC_YH_Z$. The thickness of the $SiO_XC_YH_Z$ protective layer is ranged from 300 A to 600 A. Time for depositing the $SiO_XC_YH_Z$ protective layer may be about 20 min~60 min.

EXAMPLE 1

The $SiO_XC_YH_Z$ protective layer is manufactured by the following sputtering process: the flow rate of argon gas is 320 sccm, the substrate is biased with a bias voltage of −400V, the sputtering temperature is 200° C., the sputtering time for the $SiO_XC_YH_Z$ protective layer is 40 min, the mixed target is composed of teflon and monox at a mass ratio of 4:1, a $SiO_{1.5}C_2H_6$ protective layer is formed under the above conditions, and the thickness of the $SiO_{1.5}C_2H_6$ protective layer is 500 A.

The water vapor penetration rate of the $SiO_{1.5}C_2H_6$ protective layer prepared by the method according to the embodiment of this present invention can be kept below 0.02 $g/m^2/day$.

EXAMPLE 2

The $SiO_XC_YH_Z$ protective layer is manufactured by the following sputtering process: the flow rate of argon gas is 400 sccm, the substrate is biased with a bias voltage of −300V, the sputtering temperature is 150° C., the sputtering time for the $SiO_XC_YH_Z$ protective layer is 20 min, the mixed target is composed of teflon and monox at a mass ration of 3:1, a $SiO_1C_1H_3$ protective layer is formed under the above conditions, and the thickness of the $SiO_1C_1H_3$ protective layer is 300 A.

The water vapor penetration rate of the $SiO_1C_1H_3$ protective layer prepared by the method according to the embodiment of this present invention can be kept below 0.02 $g/m^2/day$.

EXAMPLE 3

The $SiO_XC_YH_Z$ protective layer is manufactured by the following sputtering process: the flow rate of argon gas is 500 sccm, the substrate is biased with a bias voltage of −500V, the sputtering temperature is 420° C., the sputtering time for the $SiO_XC_YH_Z$ protective layer is 60 min, the mixed target is composed of teflon and monox at a mass ration of 3.5:1, a $SiO_{2.5}C_2H_8$ protective layer is formed under the above conditions, and the thickness of the $SiO_{2.5}C_2H_8$ protective layer is 600 A.

The water vapor penetration rate of the $SiO_{2.5}C_2H_8$ protective layer prepared by the method according to the embodiment of this present invention can be kept below 0.02 $g/m^2/day$.

EXAMPLE 4

The $SiO_XC_YH_Z$ protective layer is manufactured by the following sputtering process: the flow rate of argon gas is 300 sccm, the substrate is biased with a bias voltage of −350V, the sputtering temperature is 350° C., the sputtering time for the $SiO_XC_YH_Z$ protective layer is 50 min, the mixed target is composed of teflon and monox at a mass ration of 3.8:1, a $SiO_{0.5}C_{0.5}H_2$ protective layer is formed under the above conditions, and the thickness of the $SiO_{0.5}C_{0.5}H_2$ protective layer is 400 A.

The water vapor penetration rate of the $SiO_{0.5}C_{0.5}H_2$ protective layer prepared by the method according to the embodiment of this present invention can be kept below 0.02 g/m²/day.

The present invention further provides another preferred embodiment of a method for preparing an OLED device, which comprises the following steps:

providing an OLED device body as a substrate, and then the substrate is pre-treated. The pre-treating process comprises the following steps:

a surface of the substrate is successively wiped by deionized water and absolute ethanol;

the substrate is positioned in an ultrasonic cleaner filled with acetone solution and is cleaned by ultrasonic, so that impurity and oil pollution are removed from the surface of the substrate.

The surface of the substrate treated by the aforementioned pre-treating process is cleaned by plasma, so that smudge can be further removed from the surface of the substrate and binding force between the surface of the substrate and subsequent coating layers can be improved.

Plasma-enhanced chemical vapor depositing the $SiO_X$-$C_YH_Z$ protective layer: the substrate is positioned in a reaction chamber, and is heated to keep the temperature of the substrate at 200° C.~400° C. Mixed gas which is composed of trimethyl chlorine silicomethane and hexamethyl disilane at a mass ratio of 1:1~4:1 is injected into the reaction chamber. The pressure inside the reaction chamber is kept at 1200 mT~1600 mT, and high frequency AC power of 5000 w~7500 w is applied to the mixed gas to provide high frequency oscillation electrons. The electrons impact gas molecules to make the mixed gas generate plasma, and the plasma generates internal reactions to form the protective layer or reacts with the surface material of the substrate to form the protective layer.

EXAMPLE 5

Plasma-enhanced chemical vapor depositing the $SiO_X$-$C_YH_Z$ protective layer: the pressure of the reaction chamber is kept at 1200 mT, high frequency AC power of 5000 w is used to provide high frequency oscillation electrons, and the electrons impact gas molecules of mixed gas which is composed of trimethyl chlorine silicomethane and hexamethyl disilane at a mass ration of 1:1. Thus, a $SiO_{0.5}C_{0.5}H_2$ protective layer is formed on the substrate at the temperature of 200° C., and the thickness of the $SiO_{0.5}C_{0.5}H_2$ protective layer is 400 A. The water vapor penetration rate of the $SiO_{0.5}C_{0.5}H_2$ protective layer prepared by the method according to the embodiment of this present invention can be kept below 0.02 g/m²/day.

EXAMPLE 6

Plasma-enhanced chemical vapor depositing the $SiO_X$-$C_YH_Z$ protective layer: the pressure of the reaction chamber is kept at 1600 mT, high frequency AC power of 7000 w is used to provide high frequency oscillation electrons, and the electrons impact gas molecules of mixed gas which is composed of trimethyl chlorine silicomethane and hexamethyl disilane at a mass ration of 3:1. Thus, a $SiO_{1.2}C_2H_6$ protective layer is formed on the substrate at the temperature of 400° C., and the thickness of the $SiO_{1.2}C_2H_6$ protective layer is 600 A. The water vapor penetration rate of the $SiO_{1.2}C_2H_6$ protective layer prepared by the method according to the embodiment of this present invention can be kept below 0.02 g/m²/day.

EXAMPLE 7

Plasma-enhanced chemical vapor depositing the $SiO_X$-$C_YH_Z$ protective layer: the pressure of the reaction chamber is kept at 1300 mT, high frequency AC power of 6000 w is used to provide high frequency oscillation electrons, and the electrons impact gas molecules of mixed gas which is composed of trimethyl chlorine silicomethane and hexamethyl disilane at a mass ration of 4:1. Thus, a $SiO_{2.5}C_2H_8$ protective layer is formed on the substrate at the temperature of 300° C., and the thickness of the $SiO_{2.5}C_2H_8$ protective layer is 500 A. The water vapor penetration rate of the $SiO_{2.5}C_2H_8$ protective layer prepared by the method according to the embodiment of this present invention can be kept below 0.02 g/m²/day.

EXAMPLE 8

Plasma-enhanced chemical vapor depositing the $SiO_X$-$C_YH_Z$ protective layer: the pressure of the reaction chamber is kept at 1250 mT, high frequency AC power of 5500 w is used to provide high frequency oscillation electrons, and the electrons impact gas molecules of mixed gas which is composed of trimethyl chlorine silicomethane and hexamethyl disilane at a mass ration of 3:1. Thus, a $SiO_1C_1H_3$ protective layer is formed on the substrate at the temperature of 250° C., and the thickness of the $SiO_1C_1H_3$ protective layer is 300 A. The water vapor penetration rate of the $SiO_1C_1H_3$ protective layer prepared by the method according to the embodiment of this present invention can be kept below 0.02 g/m²/day.

While the present invention has been described with reference to preferred embodiments, however, the present invention is not limited to above-mentioned embodiments, those modifications, improvements and equivalent substitutions, which don't depart from the scope of the spirit and the principle of the present invention, should be included within the scope of the present invention.

The invention claimed is:

1. A method for preparing an OLED device, comprising the following steps:
   step (1), providing an OLED device body as a substrate;
   step (2), using polytetrafluoroethene and silicon oxide as a mixed target, and forming a $SiO_XC_YH_Z$ protective layer on the substrate by a magnetron sputtering coating method, wherein the value of X is 0.5~2.5, the value of Y is 0.5~2.0, and the value of Z is 2~8;
   wherein step (2) further comprising;
   positioning the substrate in a coating chamber of a magnetron sputtering coater;
   placing the mixed target, which is composed of polytetrafluoroethene and silicon oxide at a mass ratio of 3:1~4:1, in the coating chamber;
   vacuumizing the coating chamber until a base pressure therein is $3.0 \times 10^{-5}$ Torr;
   injecting argon gas into the coating chamber at a flow rate of 300 sccm~500 sccm;
   biasing the substrate with a bias voltage of −300V~−500V, so that a high-frequency voltage is generated in the coating chamber;
   heating the coating chamber to a temperature of 150° C.~420° C.;

using the mixed target as a negative pole and the substrate as a positive pole, and thus argon gas near the mixed target generates arc discharge and is ionized to generate Ar+ ions;

accelerating the Ar+ ions in an electric field to obtain extremely high energy, and then impacting the mixed target with the Ar+ ions;

sputtering out atoms on a surface of the mixed target for 20 min~60 min, and forming a protective layer made of $SiO_xC_yH_z$ on the surface of the substrate;

wherein a thickness of $SiO_xC_yH_z$ protective layer is ranged from 300 Å to 600 Å;

wherein a water vapor penetration rate of the $SiO_xC_yH_z$ protective layer is kept below 0.02 g/m$^2$/day.

\* \* \* \* \*